GATED SWITCHING CIRCUIT COMPRISING PARALLEL COMBINATION OF LATCHING AND SHUNT SWITCHES SERIES-CONNECTED WITH INPUT-OUTPUT CONTROL MEANS
Filed Dec. 28, 1965
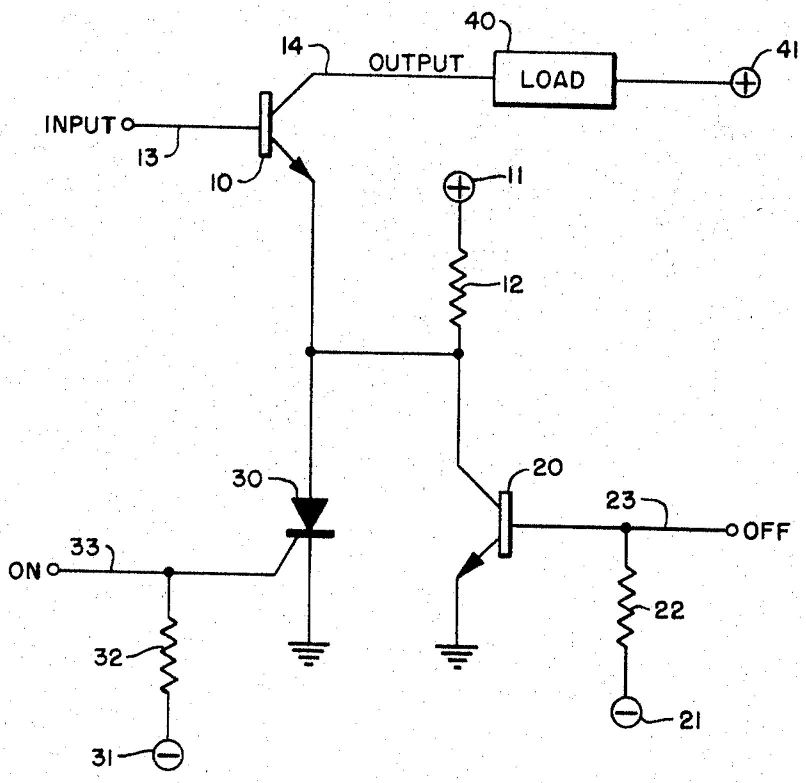
INVENTOR
RICHARD E. PETRY
BY R. C. Terry
ATTORNEY United States Patent Office 3,439,189
Patented Apr. 15, 1969

3,439,189

GATED SWITCHING CIRCUIT COMPRISING PARALLEL COMBINATION OF LATCHING AND SHUNT SWITCHES SERIES-CONNECTED WITH INPUT-OUTPUT CONTROL MEANS

Richard E. Petry, Chicago, Ill., assignor to Teletype Corporation, Skokie, Ill., a corporation of Delaware Filed Dec. 28, 1965, Ser. No. 517,001
Int. Cl. H03k *17/02, 17/56*
U.S. Cl. 307—252 8 Claims

ABSTRACT OF THE DISCLOSURE

A gated switching circuit including a first transistor having a signal input connected to its base and a signal output connected to its collector; a source of bias potential connected to the emitter of the first transistor for normally rendering the first transistor nonconductive; a silicon controlled rectifier connected to the emitter of the first transistor for selectively connecting the emitter to ground thereby rendering the first transistor conductive and thus making the signal output responsive to the signal input, and a second transistor for selectively shunting the silicon controlled rectifier to ground thereby rendering the first transistor nonconductive by disabling the silicon controlled rectifier.

This invention relates to gated switching circuits and more particularly to circuits for coupling an input to an output after an independent event has occurred.

In fabricating complex electronic systems it is frequently necessary to provide circuits for accomplishing certain desired functions. The present invention resulted from a need for a circuit which coupled an input to an output upon the occurrence of a first event and which uncoupled the input from the output upon the occurrence of a second event.

Accordingly, the object of this invention is to provide a circuit for selectively coupling and uncoupling an input and an output.

In accordance with the preferred embodiment of the invention a static latching switch is connected in series with a transistor and an output lead. An input lead is connected to the base of the transistor. When the static latching switch is in its off condition, the transistor is prevented from responding to signals on the input lead and accordingly the input may be said to be disconnected from the output. When the static latching switch is turned on the transistor is rendered responsive to the input signals and, therefore, the input may be said to be connected to the output. A second transistor is coupled in parallel with the static latching switch and is used to shunt the switch and thereby turn it off whenever it is desired to disconnect the input from the output.

A more complete understanding of the invention may be had by referring to the following detailed description when taken in conjunction with the drawing wherein there is shown a schematic illustration of a circuit employing the present invention.

Referring now to the drawing there is shown a circuit for selectively making an output responsive to an input. An NPN coupling transistor 10 is, in the initial condition, rendered nonconductive by a positive source of potential 11 which is applied through a resistor 12 to the emitter of the transistor 10. This prevents input signals, which are received over an input lead 13 connected to the base or control electrode of the transistor 10 and which are of less positive potential than the positive source of potential 11, from rendering the transistor 10 conductive and thereby prevents the impressing of a signal corresponding to the signal received on the input 13 onto an output lead 14 which is connected to the collector of the transistor 10. In this condition the input is said to be disconnected from the output.

An NPN shunting transitsor 20 is maintained in a nonconductive state by means of a source of negative potential 21 which is coupled through a resistor 22 to the base of the transistor 20. The emitter of the shunting transistor 20 is coupled to ground so that the base is maintained at a potential less positive than the emitter and accordingly, the transistor 20 is not conductive.

When it is desired to connect the input to the output, that is, when it is desired to cause signals received on the input lead 13 to make the coupling transistor 10 conductive and thereby cause corresponding signals to appear on the output lead 14 of the transistor 10, a static latching switch is turned on. The static latching switch is illustrated in the drawing as being a silicon controlled rectifier 30 but may alternatively be a silicon controlled switch, a thyratron, or the like. The silicon controlled rectifier 30 is normally held in an off condition by a source of negative potential 31 which is applied to the gate of the silicon controlled rectifier 30 through a resistor 32 and which keeps the gate of the silicon controlled rectifier more negative than its cathode which is connected to ground.

The silicon controlled rectifier 30 is turned on by a positive pulse applied to its gate lead 33. This makes the potential of the gate of the silicon controlled rectifier more positive than the potential of its grounded cathode and accordingly the silicon controlled rectifier becomes conductive. Once it is turned on the silicon controlled rectifier is kept on by current flowing from the positive source of potential 11 through the resistor 12 and through the silicon controlled rectifier to ground.

When the silicon controlled rectifier 30 is turned on a current path for a load 40 is established from a source of positive potential 41, through the load 40, through the coupling transistor 10 and through the silicon controlled rectifier 30 to ground. Since the resistance of a conductive silicon controlled rectifier is negligible the emitter of the coupling transistor 10 is maintained at a potential virtually equal to ground whenever the silicon controlled rectifier is on. Accordingly, the amount of current flowing in the current path for the load 40 is controlled by the signals appearing on the input lead 13. Since the pattern of current flow in the current path varies directly with the pattern of signals at the input, the input may be said to be connected to the output whenever the silicon controlled rectifier 30 is on.

Whenever it is desired to disconnect the output from the input, that is, to make the transistor 10 nonresponsive to signals received on the input 13, the shunting transistor 20 is made conductive by a positive pulse applied to an input lead 23 connected to the base of the transistor 20. The positive pulse on the lead 23 overcomes the effect of the negative potential 21 due to the resistor 22. This makes the potential applied to the base of the transistor 20 more positive than the potential applied to the emitter of the transistor, and accordingly, renders the transistor 20 conductive. When the transistor 20 is made conductive, the silicon controlled rectifier 30 is shunted and the silicon controlled rectifier is turned off because the amount of current flowing through it is reduced to an amount below the threshold amount of current necessary to maintain conduction.

The coupling transistor 10 is not turned off by the shunting of the silicon controlled rectifier 30 since the collector of the transistor 20 which is connected to the emitter of the transistor 10 is held at near ground potential whenever the transistor 20 is conductive. Therefore, the output 14 of the transistor 10 continues to respond to signals on the input 13 as long as the positive signal is present on the input 23 of the transistor 20. When the input 23 is removed, however, the transistor 20 is returned to its nonconductive state and, since the silicon controlled rectifier has been made nonconductive by the shunting operation, the emitter of the transistor 10 is coupled through the resistor 12 to the source of positive potential 11. This in turn disconnects the input of the transistor 10 from the output of the transistor by preventing the coupling transistor 10 from responding to signals on the input 13.

Although only one embodiment of the invention is shown in the drawing and described in the foregoing specification, it will be understood that invention is not limited to the specific embodiment described, but is capable of modification and rearrangement and substitution of parts and elements without departing from the spirit of the invention.

What is claimed is:

1. A gated switching circuit including:

a signal input;

a signal output;

a static latching switch having an on state and an off state;

means for driving the static latching switch to its on state;

shunt means connected in parallel with the static latching switch and having an on state and an off state for shunting the static latching switch and thereby driving said static latching switch to its off state whenever said shunt means is in its on state;

means for driving the shunt means to its on state and to its off state; and means connected in series with the parallel combination of the static latching switch and the shunt means for connecting the input to the output whenever the static latching switch is in its on state and for disconnecting the input from the output whenever both the static latching switch and the shunt means are in their off states.

2. The gated switching circuit according to claim 1 wherein the shunt means is an amplifier having its main conductive path connected in parallel with the static latching switch and connected in series with the means for connecting the input to the output and wherein the means for driving the shunt means to its on state and to its off state renders the amplifier fully conductive when driving the shunt means to its on state and renders the amplifier fully nonconductive when driving the shunt means to its off state.

3. The gated switching circuit according to claim 2 wherein the amplifier is a transistor having its emitter-collector circuit connected in parallel with the static latching switch and connected in series with the means for connecting the input to the output.

4. The gated switching circuit according to claim 1 wherein the means for connecting the input to the output includes a source of potential and a switch which is connected to the source of potential whenever the static latching switch is in its on state, which is disconnected from the source of potential whenever both the static latching switch and the shunting means are in their off states and which is turned on and off by the input.

5. The gated switching circuit according to claim 1 wherein the means for connecting the input to the output is an amplifier with at least one control electrode and having its main conductive path connected in series with the output and with the static latching switch and having its control electrode connected to the input.

6. The gated switching circuit according to claim 5 wherein signals are received on the input and wherein when signals are present on the input the amplifier is rendered conductive and when signals are absent from the input the amplifier is rendered fully nonconductive.

7. The gated switching circuit according to claim 1 wherein the means for connecting the input to the output is a transistor having its emitter connected to the static latching switch and to the shunting means, having its collector connected to the output and having its base connected to the input.

8. The gated switching circuit according to claim 1 wherein the static latching switch is a silicon controlled rectifier having its anode-cathode path connected in parallel with the shunting means and having its gate connected to the means for driving the static latching switch to its on state.

References Cited

UNITED STATES PATENTS

| | | | |
|---|---|---|---|
| 3,135,874 | 6/1964 | Lucas et al. | 307—88.5 |
| 3,217,176 | 11/1965 | Chin | 307—88.5 |
| 3,282,632 | 11/1966 | Arsem | 307—88.5 |
| 3,331,992 | 7/1967 | Walker | 317—148.5 |

ARTHUR GAUSS, *Primary Examiner.*

S. D. MILLER, *Assistant Examiner.*

U.S. Cl. X.R.

307—253, 254